United States Patent [19]
Mee et al.

[11] 3,946,124
[45] *Mar. 23, 1976

[54] METHOD OF FORMING A COMPOSITE STRUCTURE

[75] Inventors: Jack E. Mee, Anaheim; David M. Heinz, Orange; Thomas N. Hamilton, Fullerton; Paul J. Besser, Mission Viejo; George R. Pulliam, Anaheim, all of Calif.

[73] Assignee: Rockwell International Corporation, El Segundo, Calif.

[*] The portion of the term of this patent subsequent to Feb. 29, 1989, has been disclaimed.

[22] Filed: Mar. 2, 1972

[21] Appl. No.: 233,832

Related U.S. Application Data

[63] Continuation of Ser. No. 16,447, March 4, 1970, abandoned.

[52] U.S. Cl. .................... 427/8; 427/128; 427/131; 427/255
[51] Int. Cl.² ......................................... H01F 10/02
[58] Field of Search .......... 117/235, 239, 212, 217, 117/215, 236–238, 240; 427/8, 128, 255, 131

[56] References Cited
UNITED STATES PATENTS

| | | | |
|---|---|---|---|
| 2,919,432 | 12/1959 | Broadbent | 340/174 |
| 3,079,240 | 2/1963 | Remeika | 23/305 X |
| 3,332,796 | 7/1967 | Kooy | 117/215 X |
| 3,421,933 | 1/1969 | Pulliam | 117/235 |
| 3,429,740 | 2/1969 | Mee | 117/106 |
| 3,460,116 | 8/1969 | Bobeck et al. | 340/174 M |
| 3,511,702 | 5/1970 | Jackson et al. | 117/212 |
| 3,645,787 | 2/1972 | Mee et al. | 117/239 |
| 3,728,152 | 3/1973 | Mee et al. | 117/235 |
| 3,788,896 | 1/1974 | Mee et al. | 117/235 |

*Primary Examiner*—Bernard D. Pianalto
*Attorney, Agent, or Firm*—H. Fredrick Hamann; G. Donald Weber, Jr.; Robert Ochis

[57] ABSTRACT

A composite consisting of multiple layer structures, the basic structure of which is a chemically vapor deposited film on a substrate wafer is, disclosed herein. The film is of material which is appropriate for creating therein single wall magnetic domains which are capable of being moved about in predetermined directions within the thickness of the film and in the plane of the film. Devices are adapted to the film for sensing the motion of these domains, thereby enabling application of these structures to circuits which may be particularly utilized in memory or logic applications. A complete family of film on substrate materials is fabricated through a unique process. One of the steps of the process relates to the establishment within a reactor of the exact location of the substrate upon which deposition of the film is to be made. This is done in order to obtain desired film characteristics. Included are provisions for making multiple film layers as a matrix of films and hence a multitude of such circuits. Films used are comprised of at least three and four elements.

6 Claims, 5 Drawing Figures

FIG. 4

METHOD OF FORMING A COMPOSITE STRUCTURE

This is a continuation application of copending application U.S. Ser. No. 16,447, to Jack E. Mee et al., assigned to the common assignee, filed Mar. 4, 1970, now abandoned.

BACKGROUND OF THE INVENTION

1. Field of Invention

This invention relates to the field of chemical vapor deposition processes for producing films which are useful in magnetic bubble domain devices, and products which may be produced by the process.

2. Prior Art

The current interest in orthoferrite single crystals has been aroused by the ability to produce mobile single wall magnetic or bubble domains in thin plates of proper crystallographic orientation. These domains can be manipulated by magnetic fields to perform logic and memory functions.

Bulk orthoferrite crystals have been grown from solution, either by a molten flux technique, or a hydrothermal technique. Both methods are prone to produce crystals with solvent inclusions or voids. Solvent chemical substitution in the crystal can also occur. Single crystals resulting from either of these growth processes must be sliced and polished down to thin wafers of proper crystallographic orientation. Although very thin orthoferrite layers are desired, the limit of mechanical polishing is a few thousandths of an inch beyond which breakage becomes excessive. In addition, polishing scratches must be eliminated for they impede magnetic domain motion.

Known techniques for obtaining magnetic oxide films on crystalline substrates include spraying a suspension of reactants on heated substrates, vacuum depositing metal alloys with subsequent oxidation, and chemically depositing on a substrate from mixed nitrate solutions followed by firing of the material. More recently, certain films have been prepared by electron beam evaporation and by r-f sputtering.

The use of chemical vapor deposition methods to grow epitaxial layers of specific materials is known in the art. These techniques have been utilized to grow complex metal oxides. In general, chemical vapor deposition methods have produced films with desirable properties but the films have been difficult to reproduce.

There is a minimum domain diameter for each orthoferrite which is characteristic of that material at room temperature and for which a specific sample thickness is required. One way of reducing the characteristic domain diameter that has been described in the literature is to form solid solutions with samarium orthoferrite which has properties that depress the minimum domain diameter.

Sheets or films of polycrystalline magnetizable metals which may be subjected to magnetic influences for the purpose of creating magnetic domains have been shown in U.S. Pat. No. 2,919,432 to K. D. Broadbent. This patent specifically describes a thin sheet domain wall shift register in which a reverse magnetized domain, bounded by leading and trailing domain walls, is nucleated at an input position in the sheet and propagated along a first axis in the sheet by a step-along multiphase propagation field. Such a domain wall device usually requires or is characterized by an anisotropic magnetic sheet wherein propagation of a reverse domain is either along the easy or the hard axis. The domain walls bounding that reverse domain extend to the edge of the sheet in the direction orthogonal to the axis of propagation. Inasmuch as the walls of the domain are bounded by the edge of the sheet, propagation of the domain is constrained to one of the axes along a transverse direction of the sheet.

In U.S. Pat. No. 3,460,116 to A. H. Bobeck et al.,,, it is shown that a reverse magnetized domain may be bounded by a single wall domain. Such a domain differs from the reverse domain propagated in the Broadbent patent in that the single wall domain, encompassing the former, has a cross-sectional shape independent of the breadth of the sheet, or in other words is not bounded by the edge of the sheet. These domains are referred to as single wall domains.

The major disadvantages of both the Broadbent and Bobeck patents are that the former resorts to the use of an anisotropic film or sheet of material which results in striped or finger-like domains substantially across the entire width or length of the sheet, while the latter patent does not utilize a substrate wafer for providing structural support of the sheet of material, thereby preventing the formation of very thin sheets of material for example thicknesses below 25 microns which offer advantages in high domain density applications.

SUMMARY OF THE INVENTION

It is therefore an object of the invention to provide a chemical vapor deposition process for epitaxially producing at least one film, containing oxide compounds having such structures as the pseudo-perovskite or garnet types comprised of at least one element selected from the group consisting of the lanthanides, lanthanum or yttrium and having at least another element selected from the group consisting of aluminum, gallium, indium, scandium, titanium, vanadium, chromium, manganese and iron. The pseudoperovskite or perovskite-like type of crystal structure is one having atoms with the symmetrical relationship of those in a perovskite lattice, but which has been distorted from cubic symmetry. This film is deposited by the process described below on an oxide substrate compound wafer having at least one element selected from the group consisting of the lanthanides, lanthanum, yttrium, magnesium, calcium, strontium, barium, lead, cadmium, lithium, sodium or potassium, and having at least another element which is selected from the group consisting of gallium, indium, scandium, titanium, vanadium, chromium, maganese, iron, rhodium, zirconium, hafnium, molybdenum, tungsten, niobium, tantalum or aluminum.

It is a further object of the invention to provide the stated film on the substrate so as to enable extremely thin films to be chemically deposited and structurally supported thereon.

It is still a further object to provide a film compound attached to the substrate wafer wherein the film may be suitable for producing single wall magnetic domains therein, the single wall magnetic domains behaving in a manner attributable to a single wall domain within a virtually isotropic medium. The behavior of the single wall magnetic domain and an exemplary device showing utility of said domain is described in detail in the Bobeck et al., U.S. Pat. No. 3,460,116, noted sufra, and for the purpose of describing the theory of operation of the device set forth therein, and the principles of creating, propagating and sensing single wall magnetic domains in virtually isotropic films, this patent is incorporated herein by reference.

It is therefore also an object of this invention to provide a process and a film-on-substrate structure wherein the film and substrate provided will be single crystalline in character and where said at least one film will have virtually isotropic magnetic characteristics in the plane of the film, and alternatively have embedded or attached thereto means for providing at least one single wall domain in the film at predetermined locations in the film, means for propagating said single wall domains in any direction parallel to and within the plane or thickness of the film, and sensing means which are responsive to propagation of the single wall domain so as to determine the shift or presence of the single wall domain within said film.

It is yet a further object to utilize the properties of the film once deposited on the substrate and the single wall magnetic domains therein as may be created, for a multitude of purposes, one of which is addressed to logic circuitry applications.

It is a further objective to provide a plurality of such films as hereinabove stated inclusive of the several means for creating, propagating and sensing single wall domains therein on the same substrate for providing integrated logic devices.

Briefly in accordance with the invention, a plurality of films and substrates as hereinabove stated have been determined usable for the purpose of creating magnetic domains in predetermined locations, propagation thereof in substantially all directions in the plane of said at least one film with virtually equal degree of energy applied to move said domain and with means for sensing the shift in position of any of said magnetic domains for logic circuit applications. The structure of a shift register, illustrated and completely described in the Bobeck patent, are therefore described hereinbelow with respect to such component portions as are adapted to or are in magnetic communication with the film itself for execution of the creation, propagation and sensing functions of the magnetic domains. The equipment external to the film per se is not illustrated, as exemplary equipment used in connection with devices having single wall magnetic domains and propagation thereof are completely explained in the Bobeck patent. The instant invention, however, utilizes specific compounds for both the film and the substrate wafer which provide the desired results with added advantages of providing structural support for the film so that very thin films of less than 25 microns thick formed by the inventive process to provide advantages of very small domain areas and hence higher densities of single wall magnetic domains.

In films of single crystalline rare earth orthoferrites, it is possible to establish cylindrical magnetic domains. The net magnetization direction of these domains in most orthoferrites is perpendicular to the (001) plane at room temperature. With application of an increasing magnetic field to oppose the domain magnetization, the cylindrical domains shrink to a minimum diameter and then collapse. For many applications, high densities of domains, and hence small domain diameters, are desirable.

One way of reducing the domain diameter results from the type of growth described herein which makes use of the magnetostrictive effect in epitaxial deposits. On cooling from the deposition temperature, the difference in thermal expansion between the deposit and the substrate produces mechanical strain in each. The deposit can be properly strained so that the magnetostrictive effect reduces the effective anisotropy constant in epitaxial (001) orthoferrite films. Since the domain diameter is proportional to the anisotrophy constant, the minimum domain diameter is reduced. Even if the magnetostrictive effect is not completely isotropic, it would not appreciably affect the virtually isotropic motion of cylindrical domains in the (001) plane.

Chemical vapor deposition of orthoferrite (or garnet) films on oriented substrates provides quite pure orthoferrites since extraneous chemicals which might be incorporated into the crystal are not present. Epitaxial films can routinely be controlled to a fraction of a thousandth of an inch by controlling the duration of the growth process. Since substrates are oriented and polished before being used, no polishing of the orthoferrite is necessary. Thus chemical vapor deposition of orthoferrite films yields deposits which are purer, more perfect and thinner than those provided by bulk crystal growth methods.

The inventive process includes such steps as are necessary to determine the best physical location of the substrate in the reaction chamber in order to obtain the desired deposit of film on the substrate. The process also includes the steps of elevating the temperature of a substrate (or seed) crystal in a reaction chamber and reacting oxidizing gases and/or oxygen with gases of certain metal halides at the substrate crystal or wafer surface to deposit the film, as well as depositing a multiple number of films insulated from each other.

The process further provides for depositing films on single crystalline structure on single crystal substrate wafers in accordance with the materials selected, and in accordance with the control steps used towards accomplishment of the aforesaid product or group of products.

The process described herein contains a sequence of steps necessary to determine the proper deposition conditions and the best physical location of the substrate in the reaction chamber in order to reproduce the desired type of deposit.

EXEMPLARY EMBODIMENT

In chemical vapor deposition processes, reactant vapors are brought together near a crystal substrate (or seed) so that they react to deposit a garnet film or an orthoferrite film on a substrate wafer. Chemical vapor deposition involves the reaction between a lanthanide, lanthanum or yttrium halide and an iron halide and oxygen, but is not limited to these elements or compounds. The reaction chamber permits evaporation of the individual metal halides and intimate mixing of the vapors before they react with oxygen gas.

Figures 1, 5:
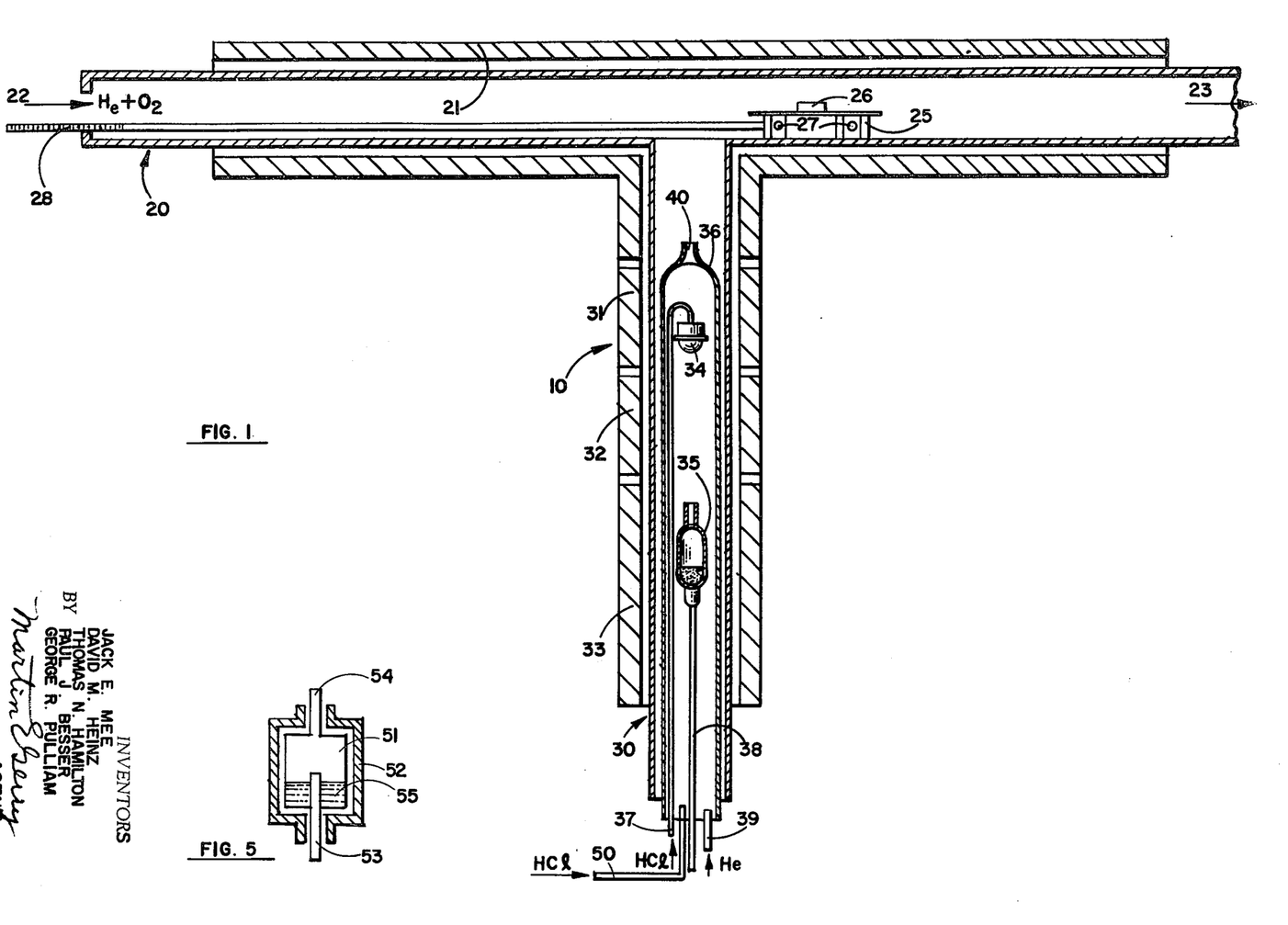
FIG. 1 is a cross-section view of the reaction chamber used in the inventive process.
FIG. 5 is a cross-section view of an auxiliary metal halide chamber and heater adaptable to an inlet of the vertical portion of the reaction chamber of FIG. 1.
Figure 2:
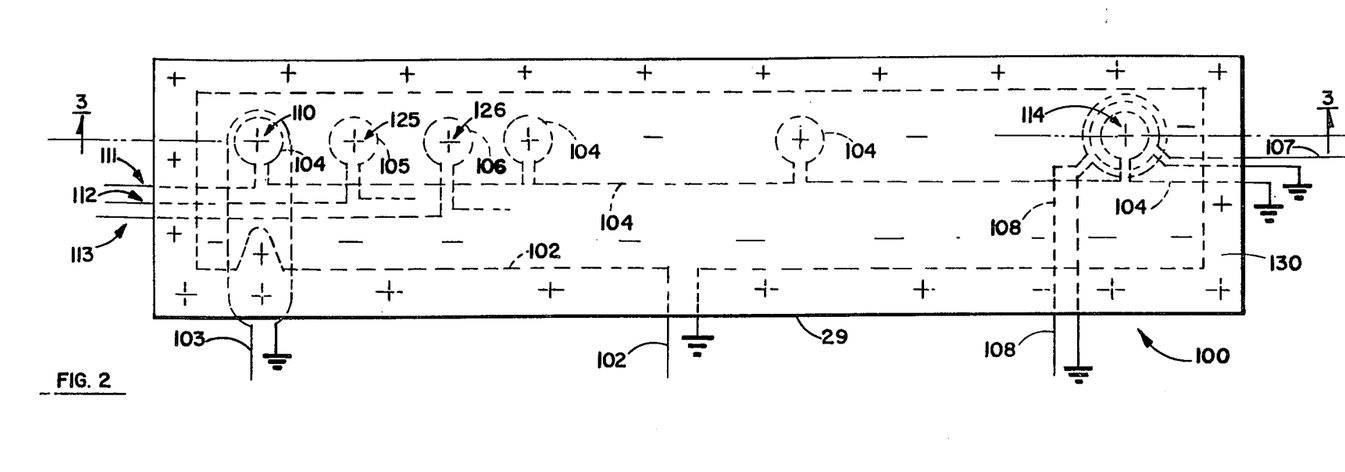
FIG. 2 is a plan view of a shift register illustrative of one type of device that may be fabricated by the inventive process.
Figure 3:
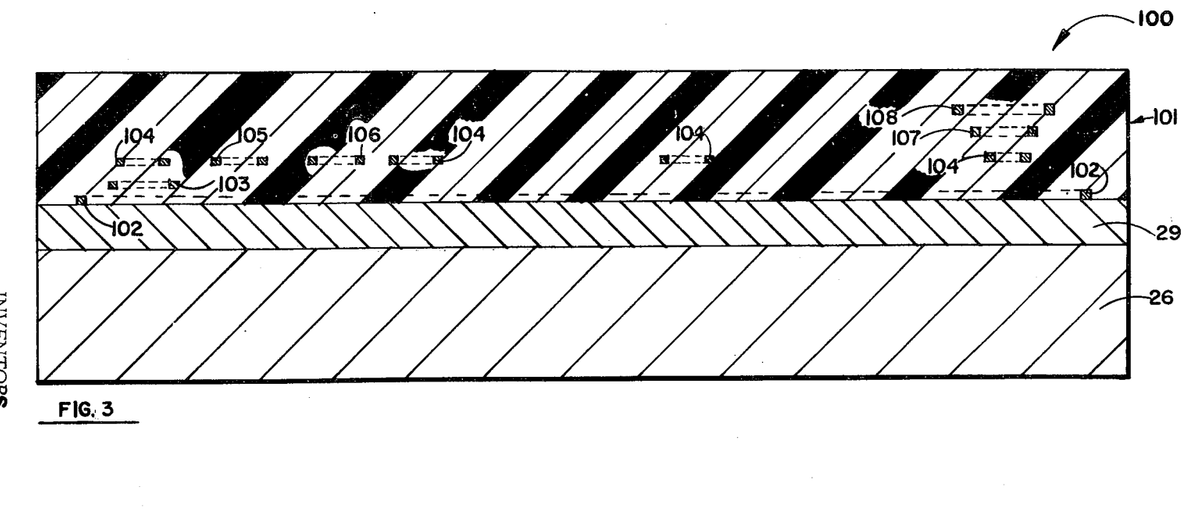
FIG. 3 is a cross-section taken at plane 3—3 of FIG. 2 showing details of the wires embedded in a layer. These wires are used for connecting to external equipments for generating, propagating and sensing motion of the single wall magnetic domains created in the film of the device.

FIG. 1 illustrates a T-shaped reactor as shown at 10 for use in film deposition. FIG. 5 illustrates an auxiliary chamber under certain conditions connected to an inlet of the premix tube 36. FIGS. 2 and 3 are illustrative of a logic device created by the process. The reactor is designed for relatively high temperatures to accomodate for example the low volatility of metallic halide source materials. The T-shaped reactor includes horizontal chamber 20 and vertical chamber 30. Disposed about the horizontal chamber is reaction zone heater 21. Individual heaters 31, 32, and 33 are disposed about the vertical chamber to control source material temperatures. Enclosed within the vertical chamber are crucibles 34 and 35 for retaining source materials therein. These crucibles are inserted in premix tube 36, positioned and adjusted to their proper locations, are held thereat and are enclosed within premix tube 36. Tubular means 37 has an inlet therein for introducing HCl gas therein as an aid in transporting the source material in crucible 34 so as to transport the source material thereof in gas form to reaction chamber 20. Tubular means 37 is also used for raising or lowering crucible 34 within premix tube 36. Crucible 35 is adjusted within the premix tube by means of support rod 38. Tubular inlet 39 is provided in premix tube 36 for injection therethrough of helium vapors. The entire premix tube 36 containing crucibles 34 and 35 together with ends of members 37, 38, and 39, extending from the premix tube can be moved up or down vertically as desired within chamber 30. Premix tube 36 is provided with an exit opening 40 at the upper end thereof for conducting the vaporized source materials mixed with the several carrier gases injected into the premix tube 36.

The flow rate of the source material from crucible 35 can be varied by varying the temperature of heater 33 for the particular embodiment shown. The flow rate of the source material from crucible 34 can also be varied by varying the temperature of heater 31 and, in addition, by varying the flow rate of the gas introduced into the crucible from the inlet of means 37. The horizontal reaction chamber includes inlet 22 through which helium and oxygen gases may be injected, and has exhaust output 23 for emitting gases from the chamber. The gases from opening 40 transport the premixed metal halide vapors into the reaction zone of the reactor.

The crystal (or seed) substrate 26 is placed on a fused-silica holder 25 in horizontal chamber 20. The position of holder 25 may be adjusted during the process if desired.

Generally, during the process, the temperature of the crystal substrate wafer is elevated by means of the reaction zone heater 21. The source material heaters 31, 32 and 33 are elevated to temperatures which provide approximately 0.1 atm. of vapor pressure of each metal halide.

After each heater has reached the desired temperature the premix tube 36 containing the source material crucibles 34 and 35 is raised into position in the vertical chamber 30. Gases are introduced into the vertical chamber through inlet member 37 and through tubular means 39 to conduct the metal halide vapors through opening 40 of the premix tube into the horizontal reaction chamber 20. Oxygen from inlet 22 of chamber 20 is then reacted with the metal halide vapors at the upper portion of the substrate crystal surface to produce the desired growth compound thereon. Specifically, an example of a typical reaction is expressable in the following approximate formulation;

$$GdCl_3(g) + FeCl_2(g) + \frac{3}{2} O_2(g) \rightarrow GdFeO_3(s) + \frac{5}{2} Cl_2(g)$$

The substrate crystal for the gadolinium orthoferrite film may be yttrium orthocaluminate or one of the other substrate compounds listed hereinbelow. Anhydrous gadolinium chloride ($GdCl_3$) and iron (II) chloride ($FeCl_2$) are contained in individual crucibles in their separate temperature zones of chamber 30.

Dry helium is introduced into the premix tube at inlet 39 to transport the $GdCl_3$ and $FeCl_2$ vapors, which are the reacting vapors of the metal halides, from the crucibles into the reaction zone of the horizontal chamber 20. Dry hydrogen chloride (HCl) gas introduced at inlet 37 flows directly into crucible 34 which holds the $GdCl_3$. The HCl gas sweeps the heavy $GdCl_3$ vapors out of the crucible into the helium gas stream and prevents the very reactive $GdCl_3$ vapors from reacting at an uncontrollably fast rate with the oxygen gas from inlet 22. Helium is injected through inlet 22, along with oxygen into the horizontal chamber 20.

The reaction deposition zone is in the downstream portion of the horizontal chamber proximate to the T-junction of chambers 20 and 30. The substrate wafer 26 is placed on holder 25 which is inserted into the upstream portion of chamber 20. The process parameters such as heat from heaters 31, 32 and 33 and gas flows through 22, 37 and 39 members may be adjusted until the desired reaction conditions are obtained, at which time substrate seed or wafer 26 on quartz holder 25 may be positioned in the downstream portion of chamber 20. To obtain information as to the exact location where the desired vapor is ready for deposition on the substrate, a test sample material similar to wafer 26 or a fused quartz test plate may be inserted on holder 25 proximate to the T-junction. A reddish-brown colored film will deposit on the material substituting for wafer 26 indicative of the orthoferrite deposition zone, when conditions for deposition and location of deposition zone are both proper. Only 2 to 4 minutes of reaction time is used for this test. Thereafter, the substituting test-sample is removed and substrate 26 on holder 25 is inserted into chamber 20 through inlet 22 and positioned exactly as determined by the calibrations on rod 28 which is determinative of the test sample positioning, so that vapors of the reaction are permitted to be deposited on the upper surface of substrate 26, thereby forming the desired monocrystalline film on the monocrystalline substrate wafer.

Details as to the positioning of the substrate in chamber 20 are important. Holder 25 has apertures 27 at either end thereof which are used for inserting therein a hooked-end of calibrated rod 28. Rod 28 positions holder 25 in its proper location so as to obtain the reddishbrown deposition on the test sample. When the reddish-brown color is obtained, the marking at rod 28 coinciding with the edge of opening 22 is noted, so that holder 25 with actual substrate 26 thereon may be reinserted and exactly positioned at the location where the reddish-brown deposition occurred. Rod 28 is removed thereafter until the film has been completely deposited, at which time rod 28 is again used for removing holder 25 together with deposited film 29 on substrate 26.

It should be noted that normally the film will deposit on the surface of the substrate 26 which is not contiguous or in contact with holder 25. Upon deposition of the film on one surface thereof, the other surface, previously in contact with holder 25 may be coated with a similar film by simply inverting the substrate so that the now-coated surface is adjoining the surface of holder 25.

It should also be noted that the above-stated process may be used in conjunction with a mask for masking such upper portions of the upper surface of substrate wafer 26 that are not desired to be coated with film 29 and leaving such portions that are to be coated uncovered by the mask. A plurality of films such as 29 may therefore be produced on any one surface of substrate wafer 26 in this manner.

An orthoferrite film composition having three metals is exemplified in column D of table 1, below. A typical reaction which results in one of these films is expressed by the following formula:

$$2YCl_3 + GaCl_3 + FeCl_2 + 3O_2 \rightarrow 2YGa_{0.5}Fe_{0.5}O_3 + \frac{11}{2}Cl_2$$

The orthoferrite film produced will as in the above test-sampling for color also show a reddish-brown color deposit on the test sample material.

When films such as garnet type preparations are desired an additional inlet 50 is provided so that dry hydrogen chloride gas may be injected therein directly for the purpose of producing proper film deposits on substrate material 26.

A garnet film composition having three metals is exemplified in column E of table 1, below. A typical reaction which results in one of these films is expressed by the following formula:

$$6YCl_3 + GaCl_3 + 9FeCl_2 + 12O_2 \rightarrow 2Y_3Ga_{0.5}Fe_{4.5}O_{12} + 39/2\, Cl_2$$

The garnet film produced will as in the above test-sampling for color show a yellow-green color deposit on the test sample material.

When a third metallic constituent is to be incorporated into a growing film, its anhydrous halide vapor must be added to those in premix chamber 36. The location of the source material container for this metal halide depends on the temperature which is required to produce an adequate vapor pressure. Thus, if it needs a higher temperature than either of the other metal halides, an additional crucible may be added above the location of 34 (not shown) and the temperatures of heaters 31 and 32 may be adjusted accordingly. If it evaporates at a temperature very close to that of one of the other constituents, it may be placed in an adjacent crucible (not shown) or it may be added in the proper compositional ratio to the contents of either 34 or 35. If the metal halide evaporates at a temperature between that of the two other constituents, an additional crucible (not shown) may be installed between the locations of 34 and 35. If the metal halide evaporates at a temperature below that of the lower crucible, an additional crucible (not shown) may be installed in tube 36 but below crucible 35. If the material evaporates at such a low temperature that any location within the vertical portion of the T-reaction chamber is excessive, the material may be heated to a more modest temperature external to the reaction chamber 30. In order to accomplish the external heating of a metal halide material, inlet 50 of FIG. 1 is connected to outlet tube 54 of chamber 51 of FIG. 5. A material 55 in chamber 51 may be used. Where the material 55 in chamber 51 is GaCl$_3$, this material has too high a vapor pressure at any temperature within premix tube 36. Therefore, external chamber 51 is situated just below the reactor chamber 30. Chamber 51 is independently heated by oven 52. Dry hydrogen chloride gas is introduced through inlet 53 which carries gallium chloride vapors through exit tube 54 and into inlet 50 of the vertical portion of the T reaction chamber. Thereafter, vapors of gallium chloride mix with those of the other metal halides and carrier gas present in the premix tube 36. The mixed halides then exit through port 40 and react with oxygen in the horizontal portion of the reaction chamber.

Films are formed on substrates in accordance with the examples in the Table 1 below, which specifies the control process parameters that were considered.

Table 1

| Materials and Conditions | Composition A | Composition B | Composition C | Composition D | Composition E |
|---|---|---|---|---|---|
| film material | GdFeO$_3$ | YFeO$_3$ | YFeO$_3$ | YGa$_{0.5}$Fe$_{0.5}$O$_3$ | Y$_3$Ga$_{0.5}$Fe$_{4.5}$O$_{12}$ |
| substrate material | YAlO$_3$ | CaTiO$_3$ | YAlO$_3$ | YAlO$_3$ | Gd$_3$Ga$_5$O$_{12}$ |
| substrate temperatures in degrees centigrade | 1145 | 1144 | 1175 | 1175 | 1175 |
| vertical helium flow rate in liters per minute | 11.5 | 5.5 | 6.0 | 11.5 | 9.5 |
| horizontal helium flow rate in liters per minute | 4.32 | 2.75 | 2.75 | 3.8 | 3.8 |
| hydrogen chloride gas flow rate in milliliters per minute | 60 | 22 | 16 | 60 | 282 |
| vertical hydrogen chloride gas flow | None | None | None | 123 | 123 |

Table 1-continued

| Materials and Conditions | Composition A | Composition B | Composition C | Composition D | Composition E |
|---|---|---|---|---|---|
| in milliliters per minute | | | | | |
| oxygen flow rate in milliliters per minute | 37 | 33 | 33 | 37 | 32 |
| $GdCl_3$ or $YCl_3$ transport rate in grams per hour | 1.13 | 1.03 | 0.516 | 1.0 | 1.45 |
| $FeCl_2$ transport rate in grams per hour | 4.47 | 1.47 | 1.18 | 4.0 | 18.0 |
| $GaCl_3$ flow rate in grams per hour | None | None | None | 0.5 | 1.95 |
| film thickness in microns | 4.5 | 6.6 | 4.1 | 3.0 | 3.0 |
| run duration in minutes | 15 | 30 | 40 | 20 | 20 |
| deposition rate in microns per hour | 18.0 | 13.2 | 6.2 | 9.0 | 9.0 |
| crystallographic orientation of the film | (001) | (001) | (101) | (001) | (100) |
| crystallographic orientation of the substrate | (001) | (010) | (101) | (001) | (100) |

Although only details of several compositions have been illustrated in Table 1, it is understood that all compositions as composed of the element formulations given in Table 2, below are applicable to this invention. For example, it was shown in column D that equal quantities of gallium and iron were present in the film. As shown in Column E, these quantities need not be equal and in fact may be varied as desired.

Several combinations of film and substrate materials have been illustrated as examples in Table 1, above. However, a number of other combinations may be provided by combining at least two of the elements of the film material with at least two of the elements of the substrate material indicated in Table 2, below. When the film material is to be used for providing single wall magnetic domains, one of the two elements thereof should be the element iron (Fe).

The elements of the group of lanthanides are herein defined as cerium, praseodymium, neodymium, promethium, samarium, europium, gadolinium, terbium, dysprosium, holmium, erbium, thulium, ytterbium, lutetium.

Following deposition of a single crystalline orthoferrite or garnet layer on a substrate, useful devices may be made such as described by U.S. Pat. No. 3,460,116. Referring to FIGS. 2 and 3, a shift register is shown at 100. A similar shift register is substantially depicted in U.S. Pat. No. 3,460,116 and its manner of operation is discussed in detail therein.

The device 100 shown in FIGS. 2 and 3 which will therefore be made by this process will be comprised of substrate 26 with film 29 deposited thereon. When the device at 100 having the capability of producing, propagating and sensing single wall domains is completed,

Table 2

| Film Compound Formula JQ-oxide | | Substrate Compound Formula JQ-oxide | |
|---|---|---|---|
| J Portion | Q Portion | J Portion | Q Portion |
| cerium | aluminum | cerium | gallium |
| praseodymium | gallium | praseodymium | indium |
| neodymium | indium | neodymium | scandium |
| promethium | scandium | promethium | titanium |
| samarium | titanium | samarium | vanadium |
| europium | vanadium | europium | chromium |
| gadolinium | chromium | gadolinium | manganese |
| terbium | manganese | terbium | iron |
| dysprosium | iron | dysprosium | rhodium |
| holmium | | holmium | zirconium |
| erbium | | erbium | hafnium |
| thulium | | thulium | molybdenum |
| ytterbium | | ytterbium | niobium |
| lutetium | | lutetium | tantalum |
| lanthanum | | lanthanum | tungsten |
| yttrium | | yttrium | aluminum |
| | | magnesium | |
| | | calcium | |
| | | strontium | |
| | | barium | |
| | | lead | |
| | | cadmium | |
| | | lithium | |
| | | sodium | |
| | | potassium | | the configuration will include at least one insulating layer 101 such as silicon monoxide (SiO) or Magnesium fluoride (MgF$_2$) which will be attached to film 29 and have the several means for producing, propagating and sensing single wall domains embedded therein and held securely thereby.

One approach to preparing layer 101, includes evaporating a metallic conductor 102 on the surface of film 29 through a suitable mask superimposed on the surface of film 29, said mask having the pattern of conductor 102 therein. This evaporation may be performed in a chamber similar to that shown in FIG. 1, wherein the contents of vessel 34 are metallic granules such as copper, gold, silver or aluminum, the other vessel 35 being removed, temperatures adjusted and oxygen flow eliminated. Following this step, the mask is removed and vessel 34 may be loaded with the insulating granules such as MgF$_2$ which are evaporated and deposited as a film over conductor 102 and over the remaining unexposed surface of film 29. Thereafter, another mask having the pattern of wire 103 may be superimposed on the insulating surface and, by having suitable metallic material in vessel 34, the pattern of wire 103 may be deposited in a similar manner to that used for the deposition of the pattern of conductor 102. After removing the mask of wire 103, an additional coating of insulating material may be deposited over the surface of wire 103 and over the remaining portions of the previously deposited insulating film. A mask having the pattern of wire 104 may then be laid down over the insulating surface and additional conductive material deposited by the same evaporation method used to form wire 103. Similarly, wires 105 and 106 may be formed by using patterns thereof formed in masks and depositing additional conductive material through the masks. Also similarly, the masks being removed, additional insulating material is deposited over wires 104, 105 and 106 and over the unexposed insulating surface upon which said wires have been deposited. A mask having the pattern of wire 107 is then laid down over the surface and wire 107 is formed in a similar manner to the formation of the other wires on the insulating surface. The mask is then removed and additional insulating material is deposited over the wire 107 and the unexposed insulating surface in the same manner as previously accomplished. A mask having a pattern of wire 108 is then laid over the insulating surface and conductor 108 is formed by the same vacuum deposition method. Finally, the mask is removed and insulating material is deposited over conductor 108 covering said conductor and possibly portions of the remaining unexposed insulating surface, thereby encapsulating all the wires within layer 101 which is now firmly attached to the surface of film 29.

It is noted that in connection with the deposition of wires 104, 105 and 106 and at their cross-over points, and possible cross-over with wires 102, 103, 107 and 108, that a wire need not be deposited in its entirety at one time, which results in the requirements that insulating material be deposited between these various wires at their cross-over locations. Suitable masks may be used in providing portions of wire depositions and insulation depositions so that the total number of individual depositions may be reduced.

It is noted that by using a suitable mask in conjunction with the process of providing layer 101 to cover such portions as are not desired to have a layer such as 101 formed thereon, and by leaving uncovered by the mask such portions as desired to be formed with layers such as layer 101, a plurality of layers such as layer 101 on any one surface of film 29 or on groups of films such as 29 may be produced in the same manner as layer 101 was produced.

Figure 4:
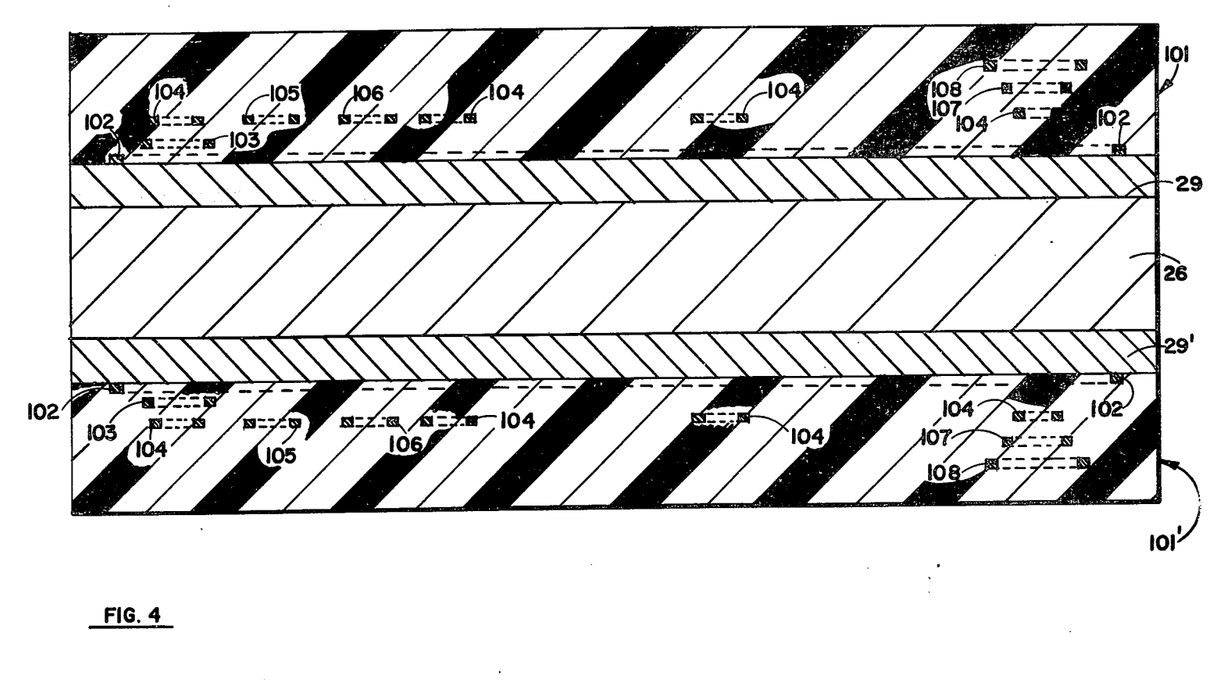
FIG. 4 is a cross-section taken at plane 3—3 of FIG. 2 showing a mirror-image film and layer containing wires embedded therein on both major deposition surfaces of the substrate.

FIG. 4 illustrates deposition of a film 29' on the other major unexposed surface of wafer 26 and thereon layer 101'. Film 29' is identical in substantive matter as film 29, and layer 101', is identical to layer 101. Both films 29 and 29' are therefore deposited in the same way, and both layers 101 and 101' are also both deposited in the same way and may contain the identical wires embedded therein. FIG. 4, is therefore illustrative of a multilayer device having magnetic domains. It is also conceivable that multiple films having magnetic and non-magnetic materials on top of each other may be deposited sequentially on the same side of the substrate surface, employing the JQ combination from Table 2 for film formation to produce the magnetic and/or non-magnetic layers of films and/or substrates.

A useful orthoferrite or garnet device at 100 will require means 101 for generating, propagating and detecting single wall magnetic domains in film 29. A current pulse in loop 103 provides means for drawing a positive region from border 130 of device 100 up to location 110, and a pulse on wire 104 at 111, isolates a portion of the positive region at location 110, thereby generating a single wall magnetic domain thereat. By sequentially pulsing wires 104, 105 and 106 respectively at 111, 112, and 113, the single wall magnetic domain is propagated along the shift register shown herein from location 110 to intermediate locations 125 and 126, ultimately terminating at location 114. At location 114, an interrogation pulse in wire 107 collapses the single wall magnetic domain, inducing a detection pulse in wire 108.

The shift register device has been discussed for the purpose of enabling the illustration of the types of additional fabrication processes required in connection with the orthoferrite or garnet layer on a substrate in the form of a useful device. Other types of devices may also require current carrying conductors, and in addition, employ magnetic layers, semiconductor layers or external optical light source and other detecting components. Wire 102 is connected to an initializing circuit for providing a pulse therein so as to rearrange the domains in film 29 to provide the border thereof as explained in U.S. Pat. No. 3,460,116.

In another approach to preparing layer 101, the current carrying conductors may be metal films laid down by vacuum evaporation. Typically, copper, aluminum, or gold may be used. The conductor patterns may be defined by masking during evaporation, or the entire area may be coated and the patterns defined by photolithographic etching processes, well known in the semiconductor device arts. Each of the conductors must be electrically isolated from the others so that layers of insulation, such as silicon monoxide (SiO) or magnesium fluoride (MgF$_2$), may be evaporated between metal evaporations as hereinabove described. Here again, the region covered by the insulating material may be limited by masking during evaporation or the entire area may be coated and patterns defined by photolithographic etching processes. The number of separate evaporation steps will depend on the number of conductor cross-overs, and the ingenuity in designing patterns for conductor and insulator depositions.

For other types of devices which employ magnetic or semiconductor layers on the surface of the orthoferrite or garnet films, suitable layers may be deposited by vacuum evaporation or chemical vapor deposition. Typically, magnetic nickel-iron alloy compositions may be evaporated on certain regions of the orthoferrite layer to provide small local fields which assist in holding or moving the single wall magnetic domains.

It should be noted that the wires shown in layer 101 or 101' could have also been replaced by magnetic means communicating with the film or films to create, propagate and/or sense the change in position of the created and propagated single wall magnetic domains.

It should be also noted that the additional film 29' deposited on the substrate as shown or in such other manner as described is also of the pseudo-pervoskite type structure and single crystalline.

Hence, due to the magnetization requirements, the components of film formulation would be iron and the remaining metallic component may be one or more of the elements detailed in Table 2. The magnetic materials or compounds of films 29 or 29' will have a first magnetization direction substantially orthogonal to an imaginary plane parallel to the thickness of said film and providing for at least one single wall magnetic domain with a second magnetization direction opposite to the first magnetization direction and having a boundary unconstrained along said second magnetization direction, said single wall magnetic domain being free to move in a plurality of directions substantially orthogonal to the second magnetization direction. At least one of the constituents of the JQ combination of the substrate wafer formulation is different from at least one of the constituents of the JQ combination of the film formulation. Such difference stresses the film which may thereby contribute to a substantial reduction in the area of the magnetic domain thus formed. The area of the domain, by the means established for creating same, is oriented orthogonally to the second magnetization direction, such area lying in said imaginary plane.

We claim:

1. A method of forming a composite structure comprising the steps of:
    providing a single crystal substrate; and
    forming a single crystal, iron-containing magnetic film less than 25 microns thick on said substrate with sufficient mechanical strain in said film to provide said film with sufficient uniaxial anisotropy for the formation of bubble domains therein,
    whereby said film has a JQ-oxide formulation wherein,
    the J constituent of said film formulation having at least one element selected from the group consisting of cerium, praseodynium, neodymium, promethium, samarium, europium, gadolinium, terbium, dysprosium, holmium, erbium, thulium, ytterbium, lutetium, lanthanum and yttrium, and
    the Q constituent of said film formulation being taken from the group consisting of iron and aluminum, iron and gallium, iron and indium, iron and scandium, iron and titanium, iron and vanadium, iron and chromium, and iron and manganese.

2. A method as described in claim 1 whereby the film is formed by the steps of:
    conducting at least one of a plurality of metal halides into a reaction chamber;
    injecting at least one reacting gas and at least one carrier gas into the reaction chamber for reaction therein with the metal halides thereby producing reaction products of the halides and gases;
    inserting a test sample for selecting the location of said substrate within said reaction chamber;
    removing said test sample; and
    inserting said substrate at the selected location for deposition of at least one of the reaction products on said substrate to form said single crystal film thereon.

3. A method as described in claim 1 wherein said JQ-oxide film is defined as $J_1Q_1O_3$ and where 1 is the sum of the two elements of the Q constituent.

4. A method as described in claim 1 wherein said single crystal substrate has a JQ-oxide formulation wherein:
    the J constituent of said substrate formulation is at least one element selected from the group consisting of cerium, praseodynium, neodymium, promethium, samarium, europium, gadolinium, terbium, dysprosium, holmium, erbium, thulium, ytterbium, lutetium, lanthanum, yttrium, magnesium, calcium, strontium, barium, lead, cadmium, lithium, sodium and potassium; and
    the Q constituent of said substrate formulation is at least one element selected from the group consisting of indium, gallium, scandium, titanium, vanadium, chromium, manganese, rhodium, zirconium, hafnium, molybdenum, tungsten, niobium, tantalum, and aluminum.

5. A method as described in claim 4 wherein:
    said J constituent of said substrate formulation is at least one element selected from the group consisting of cerium, praseodynium, neodymium, promethium, samarium, europium, gadolinium, terbium, dysprosium, holmium, erbium, thulium, ytterbium, lutetium, lanthanum and yttrium; and
    said Q constituent of said substrate formulation is at least one element selected from the group consisting of indium, gallium, scandium, titanium, vanadium, chromium, manganese, rhodium, and aluminum.

6. A method of forming a composite structure comprising the steps of:
    providing a single crystal substrate; and
    forming a first, single crystal, iron-containing magnetic film less than 25 microns thick on said substrate with sufficient mechanical strain in said film to provide said film with sufficient uniaxial anisotropy for the formation of bubble domains therein.
    whereby said film has a JQ-oxide formulation wherein,
    the J constituent of said film formulation has at least one element selected from the group consisting of cerium, praseodynium, neodymium, promethium, samarium, europium, gadolinum, terbium, dysprosium, halmium, erbium, thulium, ytterbium, lutetium, lanthanum and yttrium, and
    the Q constituent of said film formulation is taken from the group consisting of iron and aluminum, iron and gallium, iron and indium, iron and scandium, iron and titanium, iron and vanadium, iron and chromium, and iron and manganese; and
    forming a second, single crystal, iron-containing magnetic film less than 25 microns thick having a JQ-oxide formulation wherein said J and said Q constituents are taken from the same groups as set forth for said first single crystal film, said second film having sufficient mechanical strain therein to provide sufficient uniaxial anistropy for the forma-
tion of bubble domains therein.

* * * * *